(12) United States Patent
Tran et al.

(10) Patent No.: US 8,693,274 B2
(45) Date of Patent: Apr. 8, 2014

(54) SYSTEMS AND METHODS OF NON-VOLATILE MEMORY SENSING INCLUDING SELECTIVE/DIFFERENTIAL THRESHOLD VOLTAGE FEATURES

(71) Applicants: Hieu Van Tran, San Jose, CA (US); Samar Saha, Milpitas, CA (US)

(72) Inventors: Hieu Van Tran, San Jose, CA (US); Samar Saha, Milpitas, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/776,690

(22) Filed: Feb. 25, 2013

(65) Prior Publication Data

US 2013/0163363 A1    Jun. 27, 2013

Related U.S. Application Data

(62) Division of application No. 12/750,628, filed on Mar. 30, 2010, now Pat. No. 8,385,147.

(51) Int. Cl.
*G11C 7/06* (2006.01)

(52) U.S. Cl.
USPC .......................................................... 365/208

(58) Field of Classification Search
USPC .......................................................... 365/208
See application file for complete search history.

(56) References Cited

U.S. PATENT DOCUMENTS

| | | | |
|---|---|---|---|
| 5,045,488 A | 9/1991 | Yeh | |
| 6,215,148 B1 | 4/2001 | Eitan | |
| 6,258,645 B1 | 7/2001 | Kang | |
| 6,329,685 B1 | 12/2001 | Lee | |
| 6,490,212 B1 | 12/2002 | Nguyen et al. | |
| 6,999,365 B2 * | 2/2006 | Takano et al. | 365/207 |
| 2004/0047184 A1 | 3/2004 | Tran et al. | |
| 2004/0183119 A1 | 9/2004 | Negoro et al. | |
| 2004/0238897 A1 | 12/2004 | Oishi | |
| 2006/0011965 A1 | 1/2006 | Kim et al. | |
| 2008/0224774 A1 | 9/2008 | Tran et al. | |
| 2009/0016106 A1 | 1/2009 | Tran et al. | |
| 2009/0134475 A1 | 5/2009 | Min | |

FOREIGN PATENT DOCUMENTS

GB    2 016 801 A    9/1979

OTHER PUBLICATIONS

International Preliminary Report on Patentability for PCT/US2011/030619 dated Oct. 11, 2012, 10 pgs.
International Search Report and Written Opinion of the International Searching Authority, issued May 25, 2011 in corresponding PCT Application No. PCT/US11/30619, 10 pgs.
Extended EP Search Report, issued Oct. 17, 2013, in corresponding EP Application 11763403.0, 6 pages.

* cited by examiner

*Primary Examiner* — Hoai V Ho
*Assistant Examiner* — Tri Hoang
(74) *Attorney, Agent, or Firm* — DLA Piper LLP (US)

(57) ABSTRACT

Systems and methods are disclosed for providing selective threshold voltage characteristics via use of MOS transistors having differential threshold voltages. In one exemplary embodiment, there is provided a metal oxide semiconductor device comprising a substrate of semiconductor material having a source region, a drain region and a channel region therebetween, an insulating layer over the channel region, and a gate portion of the insulating layer. Moreover, with regard to the device, the shape of the insulating layer and/or the shape or implantation of a junction region are of varied dimension as between the gate-to-drain and gate-to-source junctions to provide differential threshold voltages between them.

29 Claims, 10 Drawing Sheets

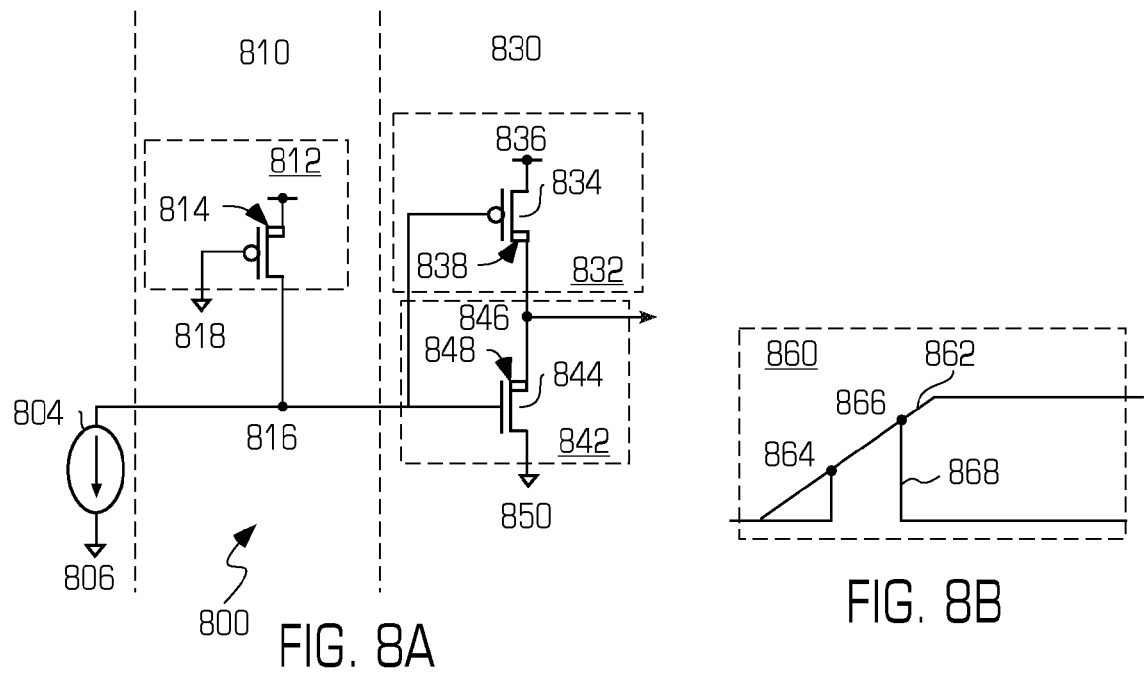
FIG. 8A
FIG. 8B
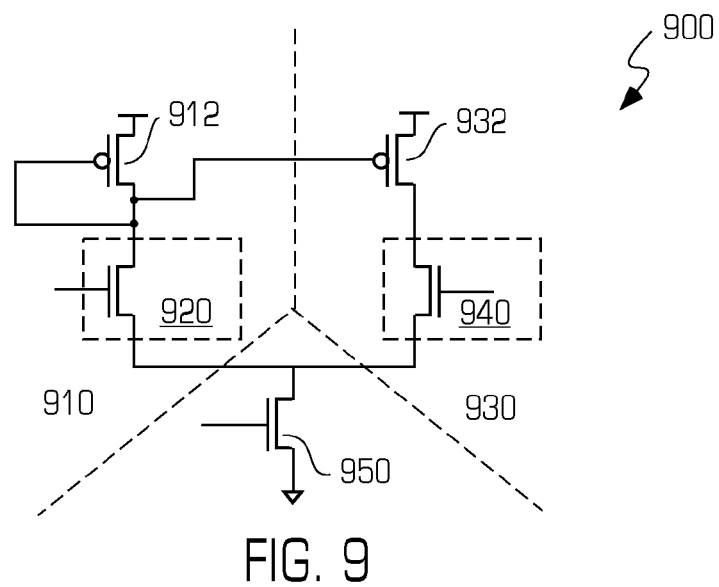
FIG. 9

= (1/Cox) * sqrt (2 -si/q NA)

SYSTEMS AND METHODS OF NON-VOLATILE MEMORY SENSING INCLUDING SELECTIVE/DIFFERENTIAL THRESHOLD VOLTAGE FEATURES

CROSS-REFERENCE TO RELATED APPLICATION(S)

This is a division of application Ser. No. 12/750,628, filed Mar. 30, 2010, published as US2011/0242921A1, now U.S. Pat. No. 8,385,147, all of which are incorporated herein by reference in entirety.

BACKGROUND

1. Field

The present invention relates to threshold voltage characteristics of MOS circuitry, and, more particularly, to sensing systems and methods associated with differential threshold voltage conditions of MOS devices, such as those in flash memory arrays.

2. Description of Related Information

Conventional MOS systems and circuitry often use MOS devices characterized by specified threshold voltage and saturation characteristics. Further, some analog signal processing systems, such as those related to array sensing, power on circuitry, comparators, ratio-related latching, buffer driving and other circuits, often have demands such as enhancing margins, increased bitline/leakage control, etc. that are closely associated with their MOS device characteristics. In flash memories, for example, readout and amplification circuitry for sensing operations may operate as a function of such threshold voltage characteristics to maintain linear operation at or throughout desired ranges present on the relevant transistor nodes.

Furthermore, many existing analog flash memory systems include MOS circuitry characterized by unsatisfactory operating points and margins.

In sum, there is a need for sensing systems and methods that may provide adequate operating conditions by, for example, providing differential threshold voltage characteristics, improving voltage operating margins or other voltage conditions, and/or otherwise rendering performance more robust.

SUMMARY

Systems and methods of sensing consistent with the innovations herein are directed to providing selective threshold voltage characteristics via MOS devices having differential threshold voltages.

In one exemplary embodiment, there is provided a metal oxide semiconductor device comprising a substrate of semiconductor material having a source region, a drain region and a channel region therebetween, an insulating layer over the channel region, and a gate portion of the insulating layer. Moreover, with regard to the device, the shape of the insulating layer and/or the shape or implantation of a junction region are of varied dimension as between the gate-to-drain and gate-to-source junctions to provide differentia threshold voltages between them.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various embodiments and aspects of the present invention and, together with the description, explain the principles of the invention. In the drawings:

FIGS. 7A and 8A are schematic diagrams illustrating exemplary systems consistent with certain aspects related to the present innovations.

FIGS. 7B and 8B are graphs illustrating performance features/characteristics of exemplary systems consistent with certain aspects related to the present innovations.

FIG. 9 is a schematic diagram illustrating an exemplary system consistent with certain aspects related to the present innovations.

DETAILED DESCRIPTION

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Within the context of flash memory systems and methods, many associated circuits are implemented via arrangements that are sensitive to threshold voltage conditions. Examples of such arrangements are differential sense amplifiers, power on circuitry, differential comparators, ratio-related latch circuitry, and buffer driving circuitry, among others. These arrangements can be implemented with a variety of components, including MOS transistors, and may include a variety of analog circuitry and concepts utilizing threshold conditions of such MOS transistors. With regard to specific features of such MOS transistors, basic construction and exemplary fabrication aspects are well known to those skilled in the art. Examples of such transistors and associated fabrication features include U.S. Pat. Nos. 5,045,488, 6,258,645, and 6,329,685, which are incorporated herein by reference in entirety.

Figure 1:
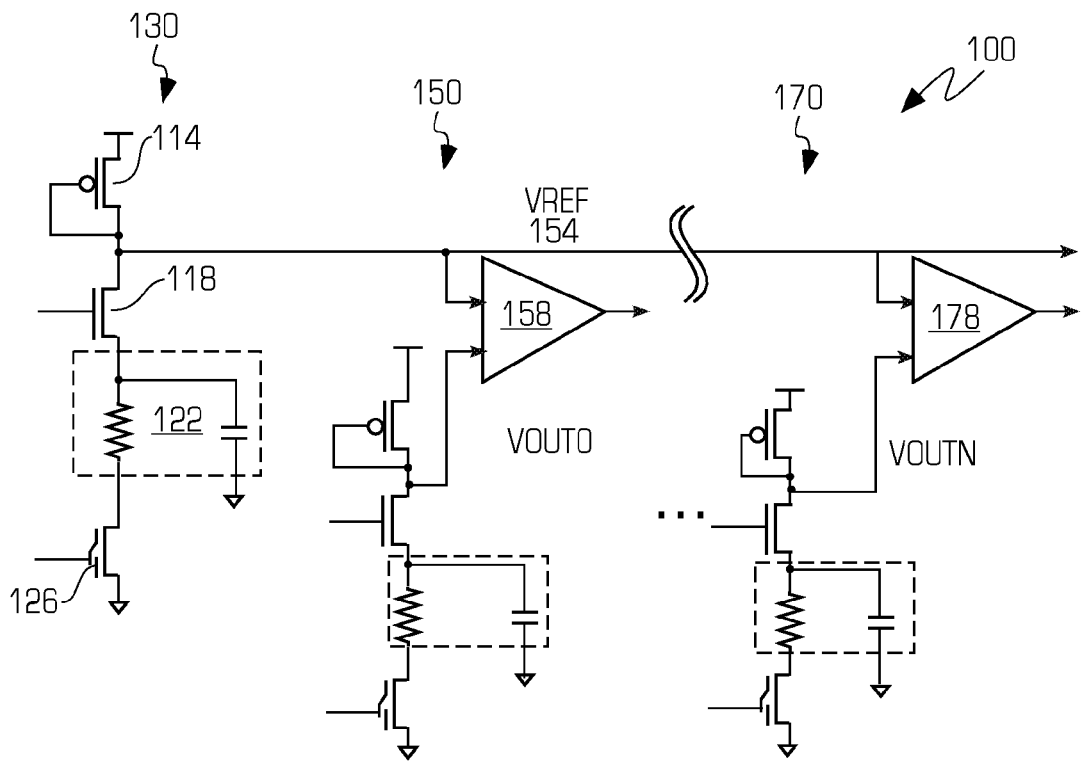
FIG. 1 is a schematic diagram of a conventional sensing system.

FIG. 1 illustrates a block diagram of a conventional system 100. Referring to FIG. 1, the conventional sensing system 100 comprises a reference column 130, a plurality of data columns, e.g., column 0 150 through column N 170, and a plurality of comparators 158, 178, etc. The reference column 130 comprises a reference memory cell 126, a MOS transistor 118 (cascoding transistor) and a diode connected MOS transistor 114 (pull-up or load transistor). A bitline RC component 122 is shown to indicate resistance and capacitance on the bitline. Not shown is a ymux (e.g., bitline selection circuit) which may, for example, be a N:1 ymux (i.e., comprised of an N quantity of MOS transistors which have all N drains connected together and N sources connects to N individual bitlines), where 1 out of N bitlines may be selected, with N=16, 64, or 512, for example. In some exemplary implementations, the ymux may be in series with transistor 118 and the bitline RC component 122, and the gates of the ymux MOS transistors may be decoded from a decoder (not shown). For the reference column 130, the ymux typically acts only as a dummy ymux (its gate is on all the times, typically connected to VDD) since there is typically only one reference cell 126, hence no selection is needed. The transistor 118 may provide a cascoding function for the sensing, meaning its source is typically regulated at a bias voltage vblbias, e.g., 0.8-1.4V, by modulating its gate at vblbias+Vt of transistor 118, with Vt being its NMOS threshold voltage. The drain of the transistor 118 is the output node regarding the sensing, which varies according the magnitude of the cell current from the memory cell 126. The cascoding function of the transistor 118 serves to isolate the RC component 122 from the sensing node 154. The reference column 130 provides a voltage reference on the reference line, Vref, 154 which is applied to a first input of each of the comparators 158 through 178. Each data column 150 through 170 may comprises a data memory cell, a MOS transistor and a diode connected MOS transistor. Another bitline RC component represents resistance and capacitance on the bitline. The ymux of the data column 150-170 is not shown. Each of the data columns 150 through 170 provides a data output voltage $V_{OUT0}$ through $V_{OUTN}$ to a second input of a respective comparator 158 through 178 so that the comparator provides an output indicative of the stored data in the corresponding data column.

The conventional sensing system 100 has non-optimum operation, such as behavior stemming from the various MOS transistors (e.g., the diode connected MOS transistor 114 within the reference column 130). Error such as non-linear operation due to a load in the saturation region may then result, for example, in failure to provide the desired linear or near linear conversion of the transistor 114 cell saturation current (Icell-sat) into an output signal (Vout). Drawbacks such as this, as well as demands for highly accurate performance, such as in dynamic reads, translate to the need for even greater improvements to operating parameters for transistors and associated circuits consistent with the principles set forth herein.

Figure 2:
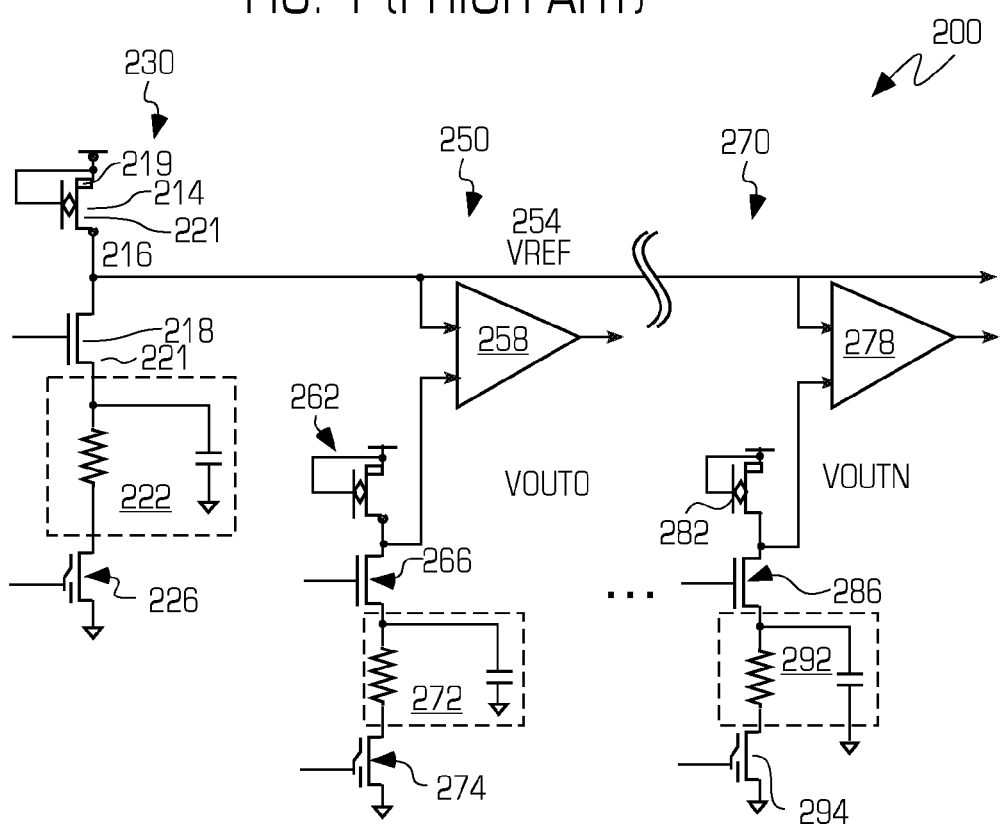
FIG. 2 is a schematic diagram illustrating an exemplary system consistent with certain aspects related to the present innovations.

FIG. 2 is a schematic diagram illustrating an exemplary system 200 implementing differential MOS transistors consistent with certain aspects related to the present innovations. Referring to FIG. 2, sensing system 200 comprises a reference column 230, a plurality of data columns, e.g., column 0 250 through column N 270, and a plurality of comparators 258, 278, etc. The reference column 230 comprises a reference memory cell 226, a differential threshold MOS transistor 218 (e.g., cascoding transistor), and a diode-connected differential threshold MOS transistor 214 (e.g., pull-up, load transistor, etc.), which may be an NMOS or native NMOS transistor, with its gate and drain connected together and acting as an output voltage node (e.g., reference) for the reference column. An RC component 222 is shown to indicate resistance and capacitance on the reference column. A ymux associated with the reference column 230 is not shown. The reference column 230 provides a voltage reference on the reference line, Vref, 254 which is applied to a first input of each of the comparators 258 through 278. Each data column 250 through 270 may comprise data memory cells 274, 294, MOS (e.g., cascoding) transistors 266, 286, and diode connected differential threshold NMOS (e.g., pull-up, load, etc.) transistors 262, 282 with gate and drain terminals connected together, and acting as (e.g., data) output voltage nodes for their respective columns. A bitline RC component 272, 292 is also shown, representing resistance and capacitance on the bitline. The ymux of the data columns 250-270, i.e., coupling from the bitline components 272, 292 and memory cells 274, 294 to the transistors 266, 286, respectively, are not shown. Each of the data columns 250 through 270 provides a data output voltage VOUT0 through VOUTN to a second input of a respective comparator 258 through 278 so that the comparator provides an output indicative of the stored data in the corresponding data column.

Differential threshold MOS transistors 214, 262, 282 of exemplary system 200 may be transistors fabricated such that physical or electrophysical differences between the drain region/structure and the source region/structure produce a threshold voltage across the drain region, Vtnd, that differs from the threshold voltage across the source region, Vtns. (Herein, Vtn refers to threshold voltage, Vt, of a NMOS transistor, Vtnd refers to Vt of a NMOS across the drain region, and Vtns refers to Vt of a NMOS across the source region.) Some exemplary details of structures and fabrication processes used to provide such devices are set forth in connection with FIGS. 11-17 and the associated written description. Turning back to the present illustration, exemplary operating conditions may yield a reference voltage of, e.g., 1.3 volts absent the present innovations. (For example, assuming threshold MOS transistors 214 (or 262, 282)=0.1V, when VDD=1.6V, VT=0.1, deltaVgs(Ids)=0.2, VREF (or VOUT) =1.6−0.3=1.3 volts.) Consistent, inter alia, with the exemplary implementation of FIG. 2, however, the physics/structure of the MOS structures may be fabricated to alter threshold voltages/saturation characteristics of the differential threshold voltage MOS devices 214, 262, 282 involved in voltage determinations. Accordingly, with regard to the reference voltage, a differential voltage MOS device 214 may be fabricated with an improved threshold voltage differential, i.e., a drain threshold voltage Vtnd (e.g., 0.1 volts) and corresponding source threshold voltage Vtns (e.g., 0.0 volts) imparting advantage over typical structures (i.e., Vtnd=0.1 volts, Vtns=0.1 volts). With such differential threshold MOS devices, the operating conditions improve regarding wider voltage range(s), for example, VREF (or VOUT)=1.6–0.0–0.2=1.4 volts, hence improving (widening) the range by 0.1V. MOS circuitry/devices that, in general, may benefit from such innovations include but are not limited to those with MOS transistors contributing to output voltage values/levels, those that trim offset, and those transitioning to or from on/off states based on small voltage swings at their nodes, among others. As such, innovations enabling ability to set differing threshold voltages, such as Vtnd and/or Vtns, enable advantages like improved bitline operations, and further examples of which are detailed below.

Figure 3A:
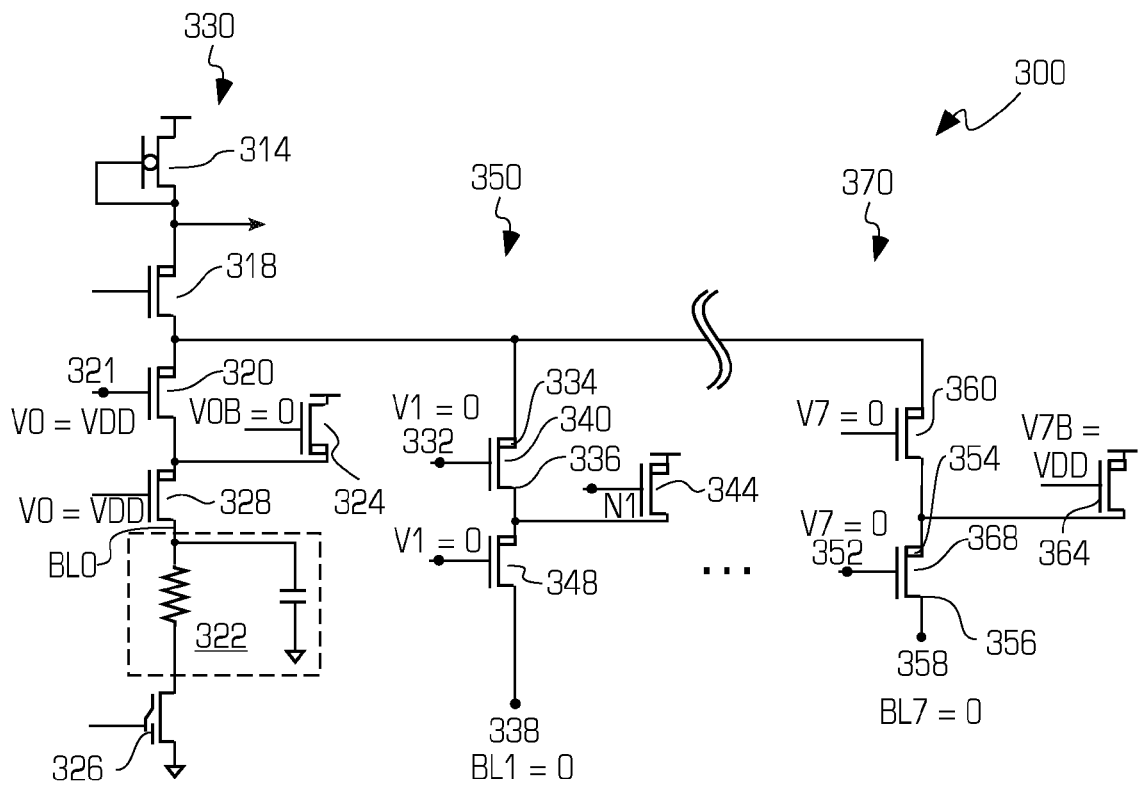
FIGS. 3A and 3B are schematic diagrams illustrating exemplary systems consistent with certain aspects related to the present innovations.

FIG. 3A is a schematic diagram illustrating an exemplary system 300 implementing differential MOS transistors and/or otherwise consistent with certain aspects related to the present innovations. Referring to FIG. 3A, exemplary sensing system 300 may comprise a (pull-up or load) diode-connected transistor 314 (which may function similarly to the NMOS transistor 214 of FIG. 2) with its gate and drain connected together and acting as a output voltage node, a cascoding differential threshold transistor 318, and a plurality of memory columns 330, 350, 370. The cascoding transistor 318 may benefit from differential threshold voltage construction as follows. To maintain the function of the transistor 318 as cascoding, its vds must be greater than vgs less Vt (vds>vgs−Vt), meaning the operating conditions are such that the transistor 318 is in saturation region. For example assuming Vt=0.2V, deltaVgs(Ids)=0.2, Vs (voltage at source of the transistor 318=bitline voltage)=0.6V, then Vgs=Vs+Vt+deltaVgs(Ids)=0.6+0.2+0.2=1V. Accordingly, Vds>Vgs−Vt=1V−0.2V=0.8V. With differential threshold construction for example Vtnd=0.2V and Vtns=0.1V, Vgs=Vs+Vtns+delatVgs(Ids)=0.6−0.1−0.2=0.9V, Vds>Vgs−Vtnd=0.9V−0.2V=0.7V. Hence the drain voltage of the transistor 318 can be operating at 0.1V lower while operation is still in a saturation condition. Hence it improves (widens) the operating voltage range by 0.1V wider range. Each memory column may comprise a ymux, an RC component, a memory cell, and a plurality of ymux transistors 320/324/328, 340/344/348, 360/364/368. Such ymux circuitry may be used, e.g., to select one bitline out of 8 bitlines to connect to the cascoding transistor 318 and load transistor 314. An RC element 322 is shown to represent resistance and capacitance on the first bitline and coupled to the ymux 321. A memory cell 326 may also be coupled to the RC component 322. (As used herein, a memory column refers to such combination of ymux, RC element and memory cell.) Further, additional RC elements as well as memory cells may be connected to the other seven bitlines BL[1:7]. The arrangement illustrated in FIG. 3A with differential (higher drain) threshold voltages, may have on/off states reducing leakage, i.e., saturating or passing voltages from the selected bitline through to sensing circuitry to minimize loss. Referring to FIG. 3A, when, e.g., the first exemplary memory column 330 is selected, differential threshold transistors 320, 324 will be in linear operation and pass the voltage from the bitline (bitline 0) through to the sensing circuitry. Further, when exemplary bitline 0 is unselected, transistor 328 pulls up the node between transistors 320 and 324 to place a reverse bias on, and shut off, transistor 320. Each of the memory columns 330, 350 through 370 provides a data output signal to enable provision of an output indicative of the stored data in the corresponding memory column.

Figure 3B:
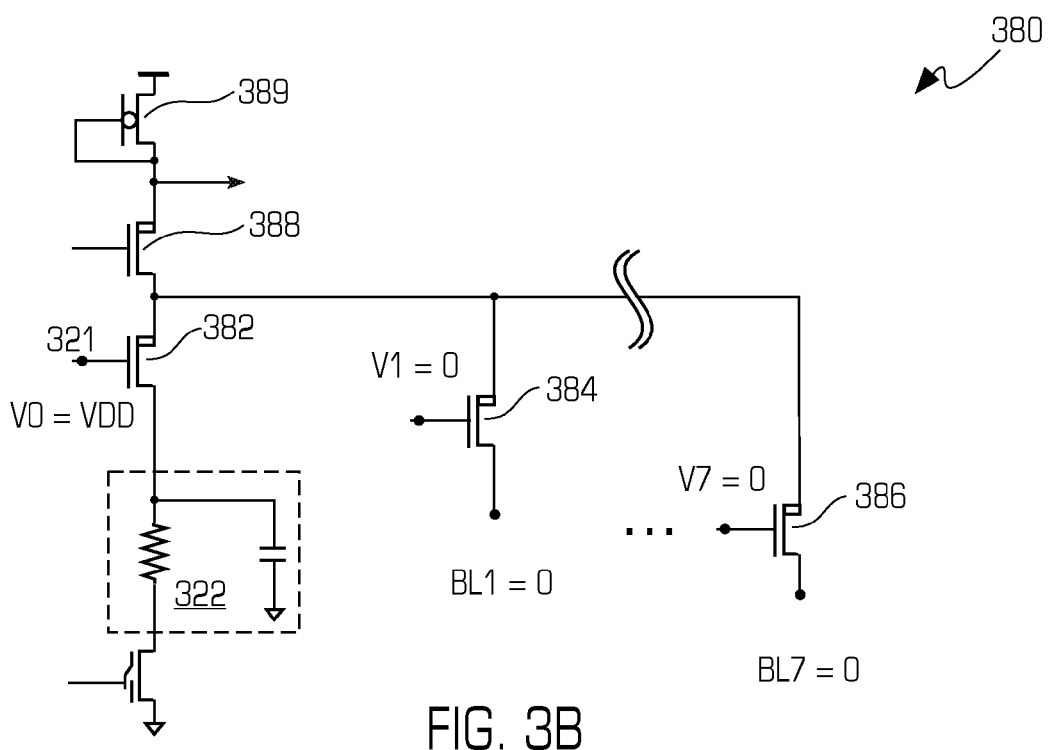

FIG. 3B is a schematic diagram illustrating an exemplary system 380 implementing differential MOS transistors and/or otherwise consistent with certain aspects related to the present innovations. Referring to FIG. 3B, exemplary sensing system 380 may comprise a (e.g., pull-up, load, etc.) differential threshold PMOS transistor 389 with its gate and drain connected together and acting as a output voltage node, a cascoding differential threshold NMOS transistor 388 and a plurality of differential threshold NMOS transistors 382, 384, and 386 consistent with those set forth herein. Here, the transistors 382, 384, 386 may, e.g., be part of a ymux 8:1 used to select a bitline out of eight bitlines to connect to the (pull-up, load) transistor 389. The transistors 382, 384, and 396 may be part of ymux circuits that belong to respective memory columns, with each memory column comprising a transistor of a ymux, a RC element and a memory cell. The first memory column comprises the NMOS transistor 382, RC element 322 and the shown memory cell. The other memory columns comprise transistor 384 and 386 (as part of ymux circuit), RC elements (not shown) and memory cells (not shown). Further, an exemplary data column may comprise the transistor 389, the cascoding transistor 388 and a plurality of memory columns as set forth above. As such, sensing systems consistent with that of FIG. 3B, may utilize higher threshold voltage across the source, Vts, e.g., to enable innovative functionality, such as improved bitline/leakage control as with FIG. 3A, wider ranges of operating conditions or voltages, and/or other such threshold-based enhancements. For example, exemplary transistors 388 (which may function similarly to the transistor 318 of FIG. 3A) and 389 (which may function similarly to transistor 314 of FIG. 3A or 214 of FIG. 2) may have a higher Vtd to enable an improved data out line voltage, e.g., improved to a wider operating voltage range, and transistors 382, 384, 386 may have a higher Vts to shut off the unselected bitlines with less leakage. Further, transistors 382, 384, 386 may have lowered drain threshold voltages to enhance their voltage passing function with less delay.

Figure 4:
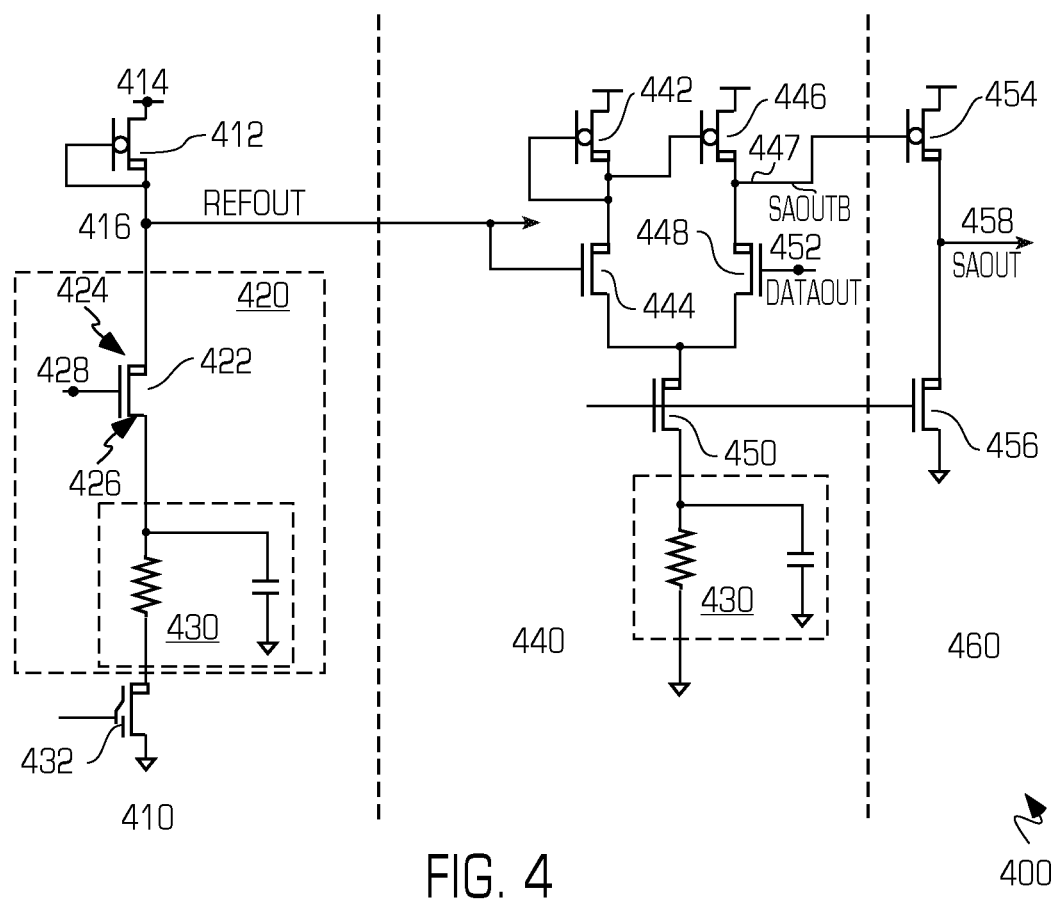
FIG. 4 is a schematic diagram illustrating an exemplary system consistent with certain aspects related to the present innovations.

FIG. 4 is a schematic diagram illustrating an exemplary system consistent with certain aspects related to the present innovations. Referring to FIG. 4, another exemplary sensing system may include a differential sense amplifier 400 comprised of a reference column 410 and a plurality of output columns 440, 460. (Here again, as with FIGS. 1 and 2, the associated ymux circuitry is not shown.) The reference column 410 may comprise a reference memory cell 432, a diode-connected differential threshold PMOS (e.g., pull-up, load, etc.) transistor 412 with its gate and drain connected together and acted as a output reference voltage node, and an additional reference column circuit 420, which may be characterized as having, e.g., at least one differential threshold NMOS (e.g., cascoding) transistor 422 and an RC component 430 representative of resistance and capacitance on the reference column 410 or circuit 420. The transistor 412 and 422 may function similarly to the transistor 314 and 318 of FIG. 3A respectively. The reference column 410 sets a voltage reference 416 on the REFOUT line, which is supplied to an input of a differential input stage 440. Another input DATAOUT 452 of the differential input stage 440 is from a data column (not shown) similar to the reference column 210 with data memory cell. The output columns include a variety of amplifier circuits and/or stages to provide desired outputs, which may include a one or more differential threshold MOS (PMOS/NMOS) transistors, such as the exemplary transistors 442, 446, 444, 448, 450, 454, 456 shown in FIG. 4. Each of the output columns may provide an output voltage, such as SAout, SAoutb (see, e.g. 447), etc., indicative of the stored data in the corresponding data column, amplified accordingly. In this illustration, use of such illustrative differential threshold voltage MOS transistors may improve the headroom (i.e., associated with transistor 422, etc.), for example by reducing the overall threshold voltage of such transistor. As such, in a typical NMOS arrangement with threshold voltages on the order of about 0.2 volts, performance can be improved by reducing the overall threshold voltage from 0.2, e.g., to approximately 0.1 to 0. Such improvement may be effected via utilization of the innovations herein, e.g., using a differential voltage NMOS transistor 422 having a higher drain threshold voltage 424 fixed to offset the source threshold voltage 426 and provide an overall effective threshold voltage of approximately 0.1 to 0. As to sensing operation, transistor 422 may act as a cascoding transistor similar to transistor 218 of FIG. 2, hence may benefit from differential threshold construction similar to that of the transistor 318 of FIG. 3A. Likewise, features of transistor 412 (e.g., pull-up, load, etc. transistor) may be implemented in a manner consistent with transistor 214 of FIG. 2, with the Vtd higher than the Vts says approximately 0.2 v) to improve the operating condition. Similarly, the input pair 444 and 448 can be used similar to that of the transistor 422. Transistors 442, 446, 454 may also be implemented in a similar manner to that of transistor 412. Further, transistors 450, 456 can be implemented similarly to that of transistor 422. Here, then, such features result in overall improvements in operating range(s) of the amplifier circuit.

Figure 5:
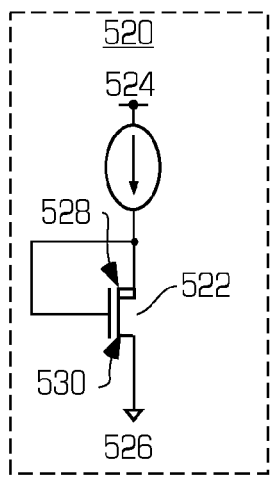
FIG. 5 is a schematic diagram illustrating exemplary systems consistent with certain aspects related to the present innovations.
Figure 5:
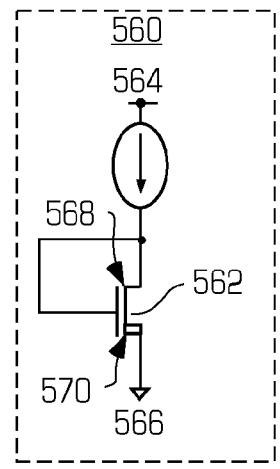

FIG. 5 is a schematic diagram illustrating exemplary systems consistent with certain aspects related to the present innovations. Referring to FIG. 5, two exemplary threshold voltage indicating arrangements 520, 560 are illustrated. A first arrangement 520 illustrates an exemplary arrangement enabling measurement of a source threshold voltage Vtns 530. To do so, first arrangement 520 may include a supply 524, an input signal controlling element, a differential threshold MOS transistor 522 that is diode connected across its drain 528, and a sink 526 to ground. Via control of the input signal controlling element and placing the drain and gate at the same voltage, an accurate measurement of the source threshold voltage Vtns may be taken via measurement of the overall threshold voltage for the transistor 522. Similarly, FIG. 5 also illustrates a second exemplary arrangement 560 enabling measurement of a drain threshold voltage Vtnd 568. To do so, the second arrangement 560 may include a supply 564, an input signal controlling element, a differential threshold MOS transistor 562 that is diode connected across its source 568, and a sink 566 to ground. Via control of the input signal controlling element and placing the drain and gate at the same voltage, an accurate measurement of the drain threshold voltage Vtnd 570 may be taken via measurement of the overall threshold voltage for the transistor 562.

Figure 6:
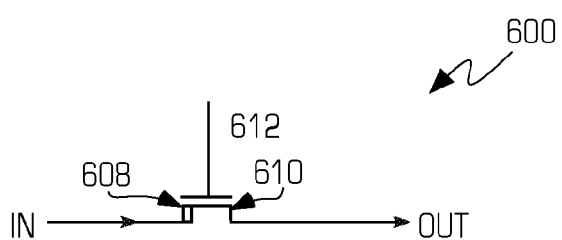
FIG. 6 is a schematic diagram illustrating an exemplary system consistent with certain aspects related to the present innovations.

FIG. 6 is a schematic diagram illustrating an exemplary system consistent with certain aspects related to the innovations herein. FIG. 6 illustrates a differential pass gate circuit 600 including a differential threshold MOS transistor 612 with, e.g., a drain region 608 having a higher drain threshold voltage, Vtnd, than the threshold voltage, Vtns, of the source 610. Such arrangements provide advantages, for example, when passing a high voltage (the high voltage will effectively cause a high Vt to be lowered via drain induced barrier lowering) as well as more effective shut off due to the presence of a high Vt region.

FIG. 7 is a schematic diagram illustrating an exemplary system consistent with certain aspects related to the present innovations. Referring to FIG. 7, a power on reset system 700 is illustrated including a plurality of differential threshold MOS transistors 704, 734, 744 and an output node 746 Vtrip. Conventional power on reset systems often suffer the drawback that the power on output, Vtrip, level is too high at low VDD in that it must be greater than or equal to, for example the sum of threshold voltages of transistors completing the circuit (i.e., transistors corresponding to transistor 704, which would be diode connected in a conventional circuit, and transistor 744). According to aspects consistent with the innovations herein, however, differential threshold voltage MOS transistors 704, 734, 744 may be utilized to manipulate the output Vtrip within improved operating margins. For example, a first differential transistor 704 (in linear region when operating; and not diode connected) may be set with a higher source threshold voltage 714 and a pair of output transistors 734, 744 may also each include a source threshold voltages 738, 748 set higher than one or both of their drain threshold voltages or than comparable (standard logic) transistors in corresponding conventional power on systems. Such arrangements enable lower "on" values to be achieved at the upper range of the output Vtrip in that the output high point (Vtriph 766 in FIG. 8) needs only to be greater than the threshold voltage Vtp of the first transistor 704 or the threshold voltage across the now-higher source threshold 748 of the output transistor 744 between the output 746 and ground in order to trip the power on reset function. In other words, the high reset Vtriph is achieved when either transistor 704, 744 is on, with the set-point being the higher threshold voltage between them. As such, operating range is improved via use of increased source threshold voltages 714, 748 of the transistors contributing to this output. In this manner, the power on reset may simply be tripped at the highest threshold voltage associated with such transistors, rather than the sum of threshold voltages. In further exemplary implementations, such systems 700 may be ANDed with a NAND gate for enabling or disabling POR, i.e., for testing, to prevent glitches, to allow reading at values less than the POR trip point (such as by a register bit or command), etc.

Figure 7A:
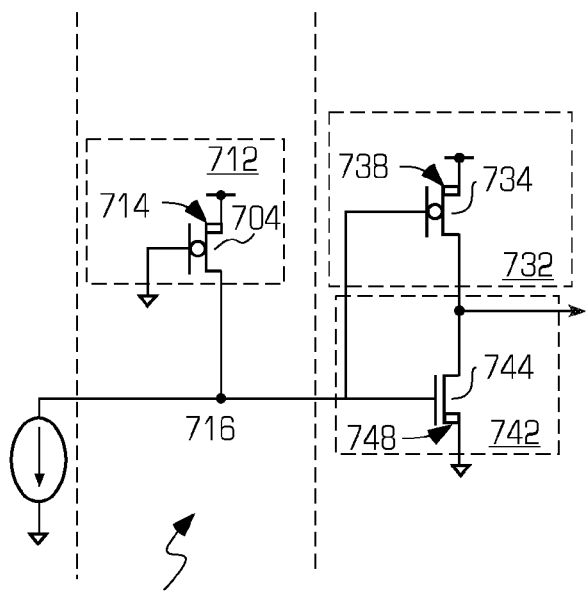
Figure 7B:
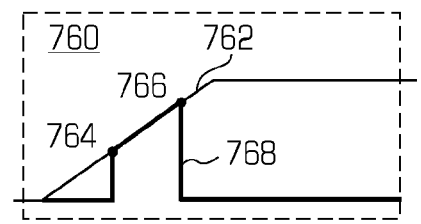

FIG. 7B is a graph illustrating performance characteristics consistent with the exemplary system of FIG. 7, according to certain aspects related to the present innovations. Referring to FIG. 7B, a power on reset ("POR") level 768 is shown graphed against a range of VDD voltage 762 to illustrate exemplary fluctuations in the output high point for POR Vtriph 766. Without the benefit of the innovations herein, Vtriph, as the sum of the two threshold voltages, would be too high for the circuit to operate properly at low VDD (i.e., as VDD approached Vtriph 766. However, the present innovation enable Vtriph to effect its reset operation when either transistor is on. As such, Vtriph may be tripped at the higher of the two threshold voltages, enabling, for example, improved operating margins at low VDD. This functionality may be achieved via differential threshold MOS transistors. In other implementations, physical dimensions may be configured to achieve higher trip point voltage due to higher threshold voltages resulting from dimensional changes or effects (such as due to short channel effect, short width effect, reverse width effect, litho-related effect, well proximity effect, OD (source/drain diffusion dimension), etc). This may be achieved, for example, via sampling different dimensions (width and length) around a peak value such as threshold voltage versus width, channel length, or OD (source/drain diffusion dimension) for the relevant transistor, such as transistors 704 and 744, here.

FIGS. 8A and 8B are diagrams illustrating a schematic and graph of another exemplary circuit/system consistent with FIGS. 7A and 7B, though reflecting differing aspects (sources and/or drains) with varied threshold voltages at different locations in such circuits.

FIG. 9 is a schematic diagram illustrating an exemplary system consistent with certain aspects related to the present innovations. Referring to FIG. 9, a system 900 is disclosed including a differential pair of MOS devices 920, 940. Improved operation may be achieved when the output device 940 is implemented using one or more low threshold voltage transistors consistent with the innovations herein. According to certain exemplary aspects, low threshold voltage device 940 may be implemented via a plurality of MOS transistors with at least two or more of the transistors having different lengths. For example, output device 940 may be implemented with 3 MOS transistor subcomponents at shown in FIG. 16, each with differing lengths, e.g., 5/0.3, 5/0.35, 5/0.4, etc. Additional aspects may be implemented via different widths, and still further aspects may be implemented via differential threshold transistors, as set forth above. According to further aspects, output device may also be implemented with composite devices, as set forth below, to realize the lower threshold voltage parameter desired for the output device 940. Such exemplary implementations also having overall advantages consistent with averaging threshold voltages across the source to minimize offset of the differential pair.

Figure 10A:
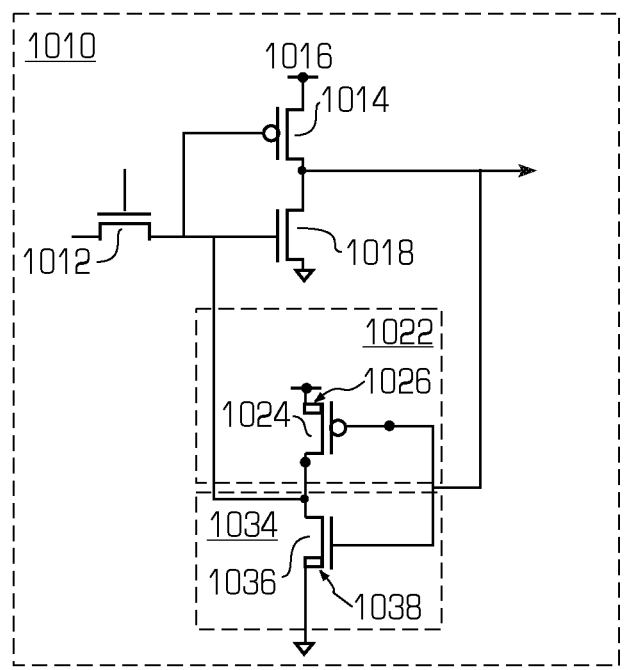
FIGS. 10A and 10B are schematic diagrams illustrating exemplary systems consistent with certain aspects related to the present innovations.
Figure 10B:
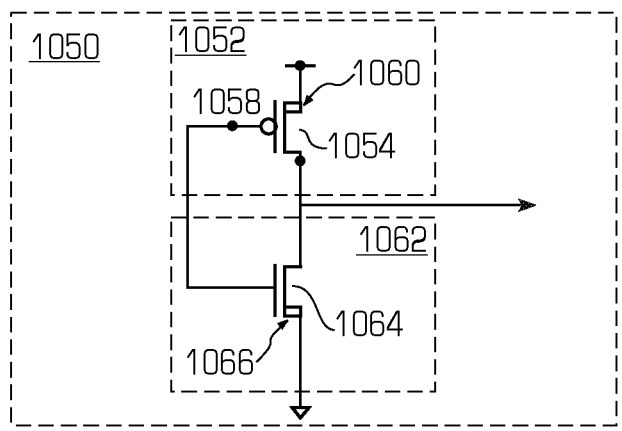

FIGS. 10A and 10B are schematic diagrams illustrating exemplary systems consistent with certain aspects related to the present innovations. Referring to FIG. 10A, an exemplary system 1010 is disclosed including a plurality of transistors 1012, 1014, 1018 and a ratio-based latching device comprised of a first circuit 1022 and a second circuit 1034. System 1010 illustrates one exemplary use of differential threshold MOS devices or transistors to improve feedback-related operating margins. System 1010, for example, shows differential threshold MOS transistors 1024, 1036 including source threshold voltages 1026, 1038 being different (in this example, higher) than their corresponding drain threshold voltages (and, hence, being higher than threshold voltage(s) of standard transistors) to provide better control of the relevant feedback and latching operations. Specifically, exemplary system 1010 enables improved voltage operating margins (here, improved voltage ratios or ranges) for feedback operations via use of differential threshold voltages to control, for example, latching of earlier circuitry as a function of circuit output. Second exemplary circuit 1050 shows another representative illustration of first and second circuits 1052, 1062 that use of differential threshold voltages to control leakage. Here, for example, differential threshold MOS transistors 1054, 1064 include source threshold voltages 1060, 1066 set to be different (in this example, higher) than their corresponding drain threshold voltages (yielding higher threshold voltage(s) than standard transistors) to provide better control of the on/off states to, inter alia, reduce leakage. Specifically, differential MOS transistors 1054, 1064 will saturate or pass voltages with less transition and delay than a higher standard threshold voltage transistor, thereby minimizing loss. Specifically, higher source (and lower drain) threshold voltages 1060, 1066 in the two MOS transistors 1054, 1064 will provide switching within narrower margins, more succinct transitioning ranges, and/or less leakage.

Figure 11A:
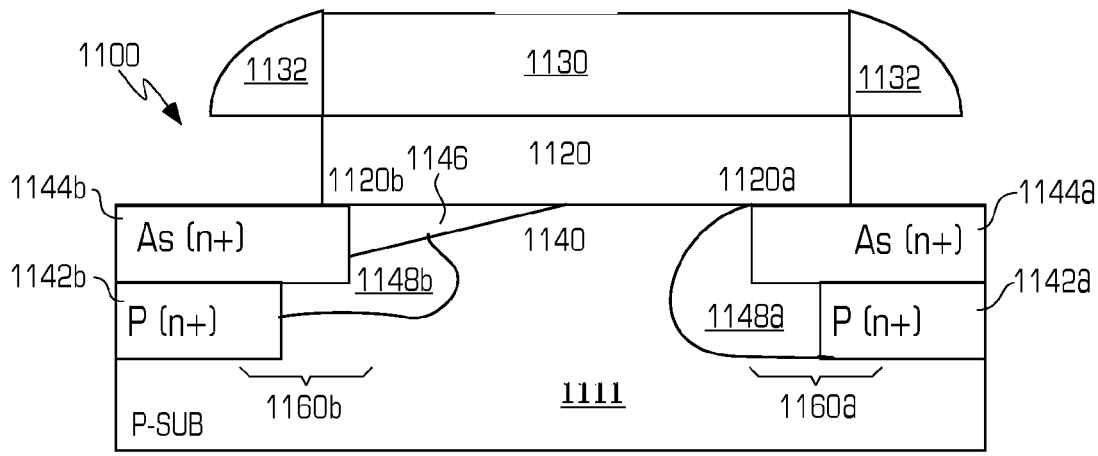
FIG. 11A is a perspective (side) view of an exemplary device consistent with certain aspects related to the present innovations.

FIG. 11A is a cross-sectional view of an exemplary MOS transistor device consistent with certain aspects related to the innovations herein. The underlying fabrication processes of such devices are well known to those skilled in the art; examples of these processes include U.S. Pat. Nos. 5,045,488, and 6,258,645, and 6,329,685, which are incorporated herein by reference in entirety. As illustrated in the exemplary device of FIG. 11A, a MOS transistor 1100 may comprise a substrate 1110 of semiconductor material of a first conductivity type, such as a P-substrate, the substrate including source and drain regions 1144, 1142. In the exemplary device shown, source and drain regions 1144, 1142 may include regions of a second conductivity type, such as upper N+ doped regions 1144a, 1144b provided, e.g., via an Arsenic (As) implantation process, lower N+ doped regions 1142a, 1142b provided, e.g., via a Phosphorus (P) implantation process. The source and drain regions 1144, 1142 are spaced apart from each other defining a channel region 1140 therebetween. An insulating layer 1120 is disposed over the channel region of the substrate, including a first insulating portion 1120a proximal to the first source/drain region and a second insulating portion 1120b proximal to opposed source/drain region. Additionally, a gate portion 1130 is disposed above the insulating layer. Further, the channel region 1140 comprises opposed junction regions including a first junction region 1160a adjacent one source/drain region 1144a, 1142a and a second junction region 1160b adjacent the complementary source/drain region 1144b, 1142b. The MOS transistor may also include an inversion region 1146. Further, according to aspects consistent with the innovations herein, one or both of the shape or the implantation (i.e., type or composition of implantation, density of implantation, concentration of implantation, and/or variation through a transition region, etc.) of the first junction region 1160a or the second junction region 1160b are of varying dimension to provide a first threshold voltage associated with that junction region which differs from a second threshold voltage associated with the opposed junction region. For example, the semiconductor materials comprising the region may be of a different shape or size than that of the opposed region to impart this differing threshold voltage, the implantation may be of differing type or composition (doped with differing ions/compounds, dosages, processes and angles, etc.), of differing density/concentration, of varying size, location, strength, or of variations of two or more of such differences, and/or the threshold voltage may be set differently based on combinations of the above.

In the exemplary device illustrated in FIG. 11A, an area of higher depletion may be formed at the first junction region 1150a via creation of a larger supplemental implant 1148a, such as P+ implant of, e.g., Boron (B), other Halo materials, etc. While previous implantation has included creation of pocket implants generally used to suppress short channel effects, supplemental implants consistent with aspects of the present innovations provide for particularized barrier loading features applicable to the circuitry disclosed herein. As such, the threshold voltage of the first junction region (e.g., drain) may be set higher (e.g., 50 mV-500 mV, etc.) than that of opposed junction region, via such drain-induced barrier loading, based on the variations set forth above, such as dose and angle. For example, one or both of shape and implantation of the first junction region or the second junction region may be varied via a supplemental implant to provide a device having different threshold voltages as a function of the supplemental implant. Similarly, the shape and/or the implantation of the first junction region or the second junction region may be varied via one or more supplemental implants to provide a device having different threshold voltages as a function of the one or more supplemental implants.

Figure 11B:
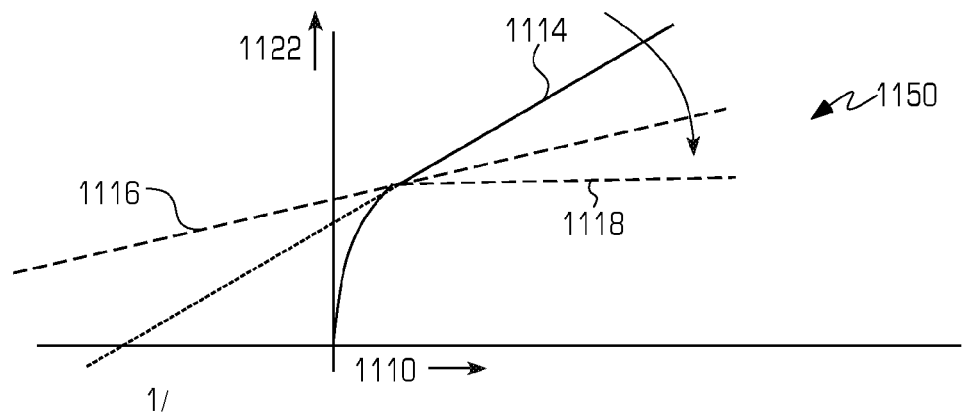
FIG. 11B is a graph illustrating performance features/characteristics of an exemplary device consistent with certain aspects related to the present innovations.

FIG. 11B a graph illustrating exemplary performance features of a exemplary device consistent with certain aspects related to the present innovations. Graph 1150 is a graph of drain to source current, Ids, 1122 versus drain to source voltage, Vds, 1110 illustrating characteristics of a junction having such an exemplary supplemental implant. Graph 1150 depicts various performance characteristics of such junctions, e.g., a higher Rout provided via the relationship between current and voltage, Ids=I/(1+λ)*Vds. As such, Rout will increase inversely as the slope of 1/λ decreases, as shown by the series of slopes 1114, 1116, 1118, which illustrate increasing gain (Rout) with increased doping.

Figure 12:
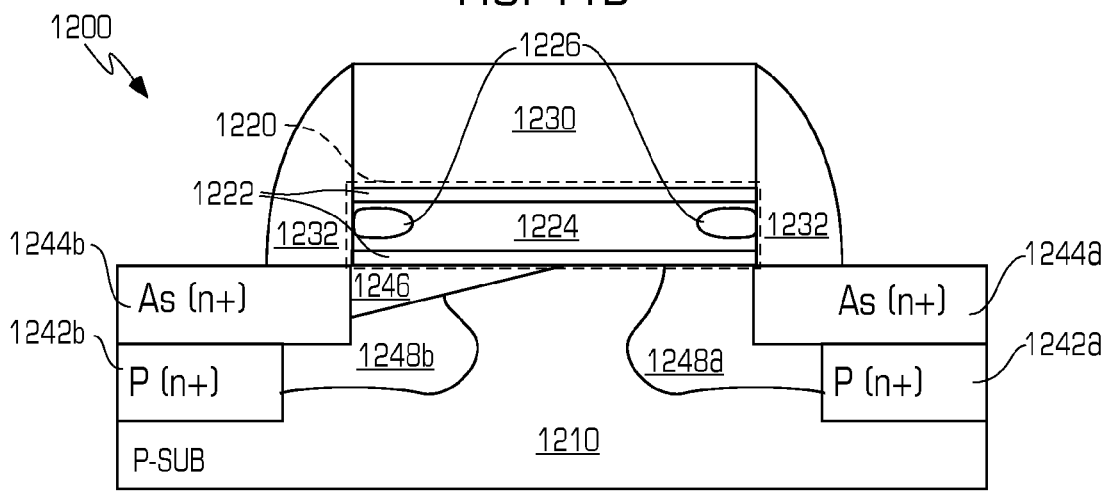
FIG. 12 is a perspective (side) view of an exemplary device consistent with certain aspects related to the present innovations.

FIG. 12 is a perspective (side) view of an exemplary device consistent with certain aspects related to the present innovations. The MOS device 1200 of FIG. 12 includes some of the same or similar features as that of FIG. 12, though illustrating some features associated with the oxide or insulating layer to provide a differing threshold voltage for one source/drain as opposed to the other. As illustrated in the exemplary device of FIG. 12, a MOS transistor 1200 may comprise a substrate 1210 of semiconductor material of a first conductivity type, such as a P-substrate, the substrate including source and drain regions 1244, 1242. In the exemplary device shown, source and drain regions 1244, 1242 may include regions of a second conductivity type, such as upper N+ doped regions 1244*a*, 1244*b* provided, e.g., via an Arsenic (As) implantation process, lower N+ doped regions 1242*a*, 1242*b* provided, e.g., via a Phosphorus (P) implantation process. The source and drain regions 1244, 1242 are spaced apart from each other defining a channel region 1240 therebetween. An oxide/insulating region 1220 is disposed over the channel region of the substrate. Additionally, a gate portion 1230 is disposed above the oxide/insulating region 1220. Further, the channel region 1240 comprises opposed junction regions including a first junction region 1260*a* adjacent one source/drain region 1244*a*, 1242*a* and a second junction region 1260*b* adjacent the complementary source/drain region 1244*b*, 1242*b*. The MOS transistor may also include an inversion region 1246.

Turning to the features associated with the oxide/insulating layer, an exemplary oxide/insulating region 1220 consistent with the innovations herein may include one or more oxide or other insulating/dielectric layers 1222, and a nitride layer 1224 that utilizes nitride charge trapping with loci (see, e.g., trapped charge 1226 shown in FIG. 12 for purposes of illustration) at the source and drain regions to control source threshold voltage, Vts, and drain threshold voltage, Vtd. The processes for fabricating devices that employ nitride charge trapping are well known to those skilled in the art. Some examples of such devices and processes are set forth, inter alia, in Nonvolatile Semiconductor Memory Technology, IEEE, edited by William D. Brown and Joe Brewer, 1998, incorporated herein by reference and appended hereto (see, e.g., pp. 47-50, esp., section 1.4.2.2 SONOS Devices pp. 49-50). While, again, the trapped charge 1226 is depicted in FIG. 12 for purposes of illustration, the charge trapping region or regions may also be characterized as being adjacent the source or drain to control the corresponding threshold voltage. Further, with the present example is described in the context of nitride, charge trapping regions of other composition may otherwise be utilized. Similarly, while the present exemplary charge trapping region is described in the context of a layer, other shapes and arrangements of materials may also be used. Turning back to the present innovations, creation of loci or regions of trapped charge at the source, or manipulations of the source threshold voltage, can be used in exemplary systems set forth herein, including but not limited to trimming the offset of differential pairs in comparators or operational amplifiers. Such loci or regions of trapped charge at the drain, or manipulations of the drain threshold voltage, can also be used in exemplary systems set forth herein, including but not limited to trimming the operating point at drain side, for example, of a differential pair in comparators or operational amplifiers.

Figure 13A:
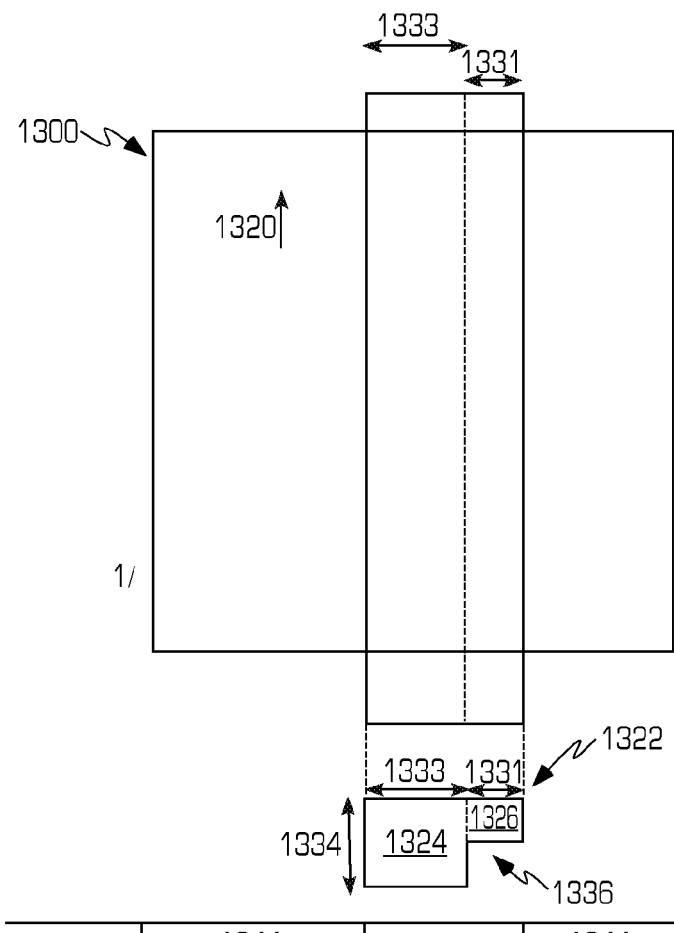
FIG. 13 is a perspective (top and side) view of an exemplary device consistent with certain aspects related to the present innovations.
Figure 13B:

FIGS. 13A and 13B are perspective (top and side) views of an exemplary device consistent with certain aspects related to the present innovations. Exemplary MOS semiconductor device 1300 shown in FIGS. 13A and 13B may include a substrate of semiconductor material of a first conductivity type 1310, source/drain regions 1344 in the substrate, wherein the source region and the drain region are of a second conductivity type and spaced apart from each other defining a channel region therebetween, an insulating layer 1322 disposed over the channel region of the substrate, and a gate portion over the insulating layer. For purposes of description, the insulating layer 1322 may be viewed as being composed of opposed insulating regions or "portions," including a first insulating portion 1322 adjacent the first source/drain region and a second insulating portion 1326 adjacent the opposed source/drain region, wherein each insulating portion defines or characterizes a threshold voltage between the gate and the source/drain associated with each insulating portion.

Furthermore, according to certain aspects consistent with the innovations herein, the first insulating portion or the second insulating portion may fabricated with varying dimension, including thickness 1334, to provide a first threshold voltage that differs from a second threshold voltage associated with the opposed insulating portion. Dimensions that may be varied in the insulating layer to achieve these advantages include the thickness 1334 as well as the widths (distance or dimension across channel) 1333, 1331 of the first insulating portion 1324 and the second insulating portion 1326. In exemplary systems, where this second insulating portion represents an oxide region of less thickness than the first insulating portion, the linear dimension of the width 1331 may be decreased to reduce the threshold voltage, similar in function to dimensional changes to depletion regions that may impart change to voltage characteristics. A threshold voltage decrease may also be effected via reduction(s) in width to the first and/or second insulating portions. Further, use of thicker oxide for the second insulating portion 1326 will make for a higher threshold voltage across the associated (adjacent) source/drain. Oxide dimensioning may also be characterized as taking the form of an offset region or offset 1336 in the overall insulating layer 1322. For example, the offset may be a region defined by, such as a substantially rectilinear shape over the source/drain region for which a differential threshold voltage is desired. According to some exemplary aspects, dimensioning consistent with the above may impart differential threshold voltage conditions between source and drain on the order of about 0.1 volts to about 0.5 volts.

Figure 14:
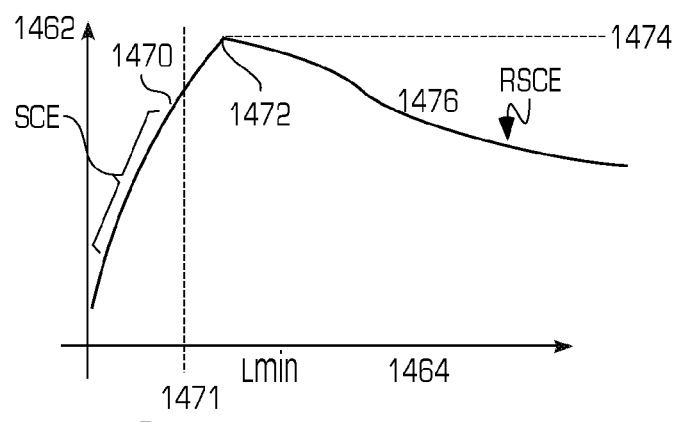
FIG. 14 is a graph illustrating performance features/characteristics of an exemplary device consistent with certain aspects related to the present innovations.

FIG. 14 is a graph illustrating performance features/characteristics of an exemplary device consistent with certain aspects related to the present innovations. Graph 1400 of FIG. 14 is an exemplary graph of threshold voltage 1462 versus length 1464 for exemplary devices such as the MOS transistor shown in FIG. 13. Graph 1400 helps illustrate a representative relationship between the threshold voltage associated with, for example, second insulating portion 1326 as its length 1331 dimension varies. As shown, when the length dimension is in its smaller range (characterized, inter alia, via line Lmin 1471) the graph of voltage versus length is characterized by a curve of positive slope, or a threshold voltage that increases as length increases (also referred to as SCE or Short Channel Effect). As the length increases beyond a certain threshold 1472, however, the relationship has a negative slope, with the threshold voltage beginning to decrease 1476 as length increases further (also referred to as a RSCE or Reverse Short Channel Effect point 1474). Based on these characteristics, a maximum threshold voltage may be established and shifted according to design and fabrication parameters, and a minimum threshold voltage may be determined or established as a function of short length characteristics. These features, for example, provide advantages to applications such as those requiring offset of differentials pairs, especially in situations where design, fabrication and operation features may be determined as a function of short length and minimum threshold voltage characteristics. Similar relationships and advantages exist with regard to Narrow Width Effect and Reverse Narrow Width Effect characteristics of exemplary devices consistent with the innovations herein.

Figure 15:
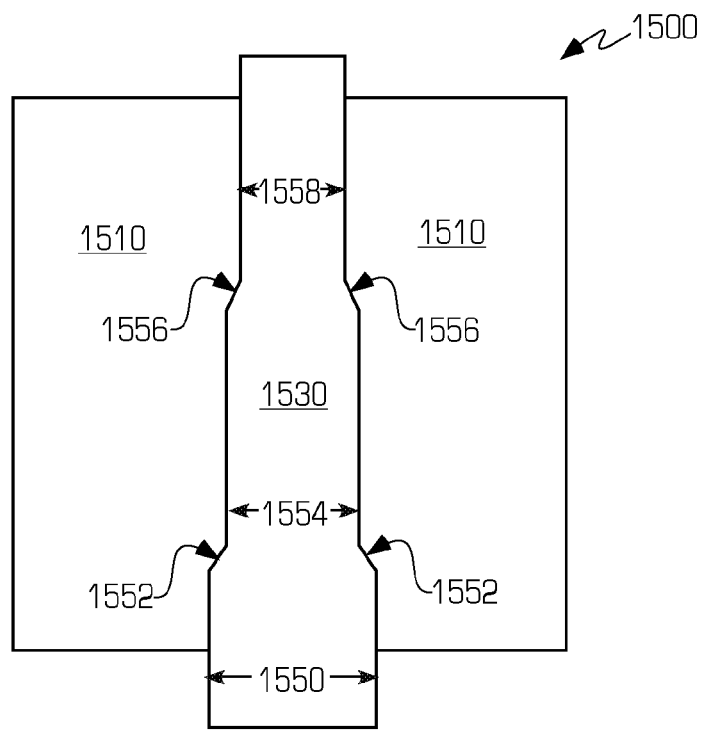
FIG. 15 is a perspective (top) view of an exemplary device consistent with certain aspects related to the present innovations.

FIG. 15 is a perspective (top) view of an exemplary device consistent with certain aspects related to the present innovations. Referring to FIG. 15, a composite device 1500 is shown including a substrate 1510 with source/drain regions, and an oxide region 1530 of varying dimension. Consistent with such exemplary aspects, a metal oxide semiconductor device may include a substrate 1510 of semiconductor material of a first conductivity type, a source region and a drain region in the substrate, wherein the source region and the drain region are of a second conductivity type and spaced apart from each other defining a channel region therebetween, an insulating layer 1530 disposed over the channel region of the substrate, and a gate portion above the insulating layer. The oxide region 1530 may be characterized as having first and second parts or "insulating portions," similar to those set forth above, each associated with complementary source and drain regions. In the exemplary illustration of FIG. 15, the first insulating portion or the second insulating portion is fabricated of varying length and width, and of different dimension than the opposed insulating portion, to provide a first threshold voltage that differs from a second threshold voltage associated with the opposed insulating portion. In FIG. 15, to illustrate creation of differing threshold voltages as a function of dimension, exemplary oxide region 1530 is shown with 3 portions 1550, 1554, 1558 of differing width (i.e., distance across channel). Each of these portions may also be characterized by transition regions 1552, 1556 that reflect changes from each region's differing length and width. With regard to the exemplary device illustrated, each of the 3 overall regions would then typically be characterized by differing threshold voltages, with an overall or composite threshold voltage for each source or each drain being determined as a function of each threshold voltage subcomponent.

Figure 16:
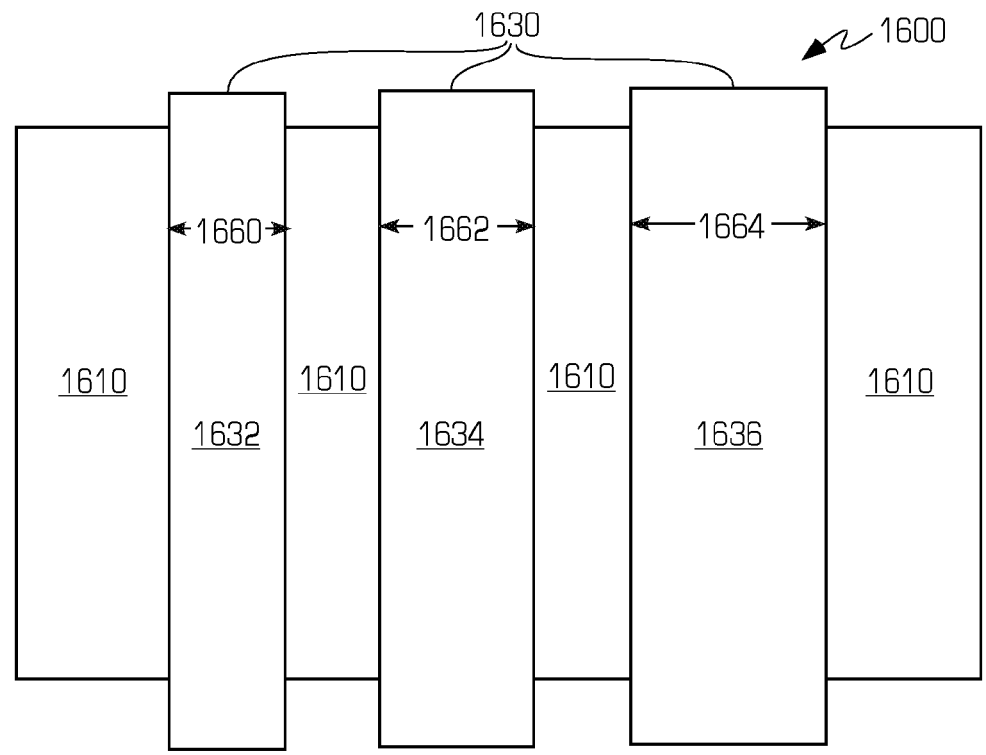
FIG. 16 is a perspective (top) view of an exemplary device consistent with certain aspects related to the present innovations.

FIG. 16 is a perspective (top) view of an exemplary device consistent with certain aspects related to the present innovations. Referring to FIG. 16, a series device 1600 is shown including a substrate 1610 with source/drain regions, and oxide regions 1630 of varying length. Consistent with such exemplary aspects, a metal oxide semiconductor device may include two or more transistor subcomponent electrically arranged in series, each transistor subcomponent including a substrate 1610 of semiconductor material of a first conductivity type, a source region and a drain region in the substrate, wherein the source regions and the drain regions are of a second conductivity type and spaced apart from each other defining channel regions therebetween, one or more insulating layers 1630 disposed over the channel region of the substrate, each having a gate portion located above the insulating layer. The illustration of FIG. 16 depicts 3 transistor subcomponents, although embodiments with two or with more than 3 may also be consistent with the innovations herein. As shown, exemplary MOS device 1600 includes a first oxide region 1632 ("first insulating portion") of a first transistor subcomponent, a second oxide region 1634 ("second insulating portion") of a second transistor subcomponent, and a third oxide region 1636 ("third insulating portion") of a third transistor subcomponent. Structures having two transistor elements may, for example, be characterized as having a first insulating portion of a first transistor fabricated of a first length (i.e., distance across the first channel) that is different than a second length of a second insulating portion of a second transistor subcomponent. Oxide regions, placed in such series relationship to each other, define various threshold voltages for each subcomponent with the highest threshold voltage determining the overall or composite threshold voltage of the device, and may thereby provide a first threshold voltage of the device that differs from a second threshold voltage of the device. In a like manner, structures have three or more transistor elements may include similar relationships between all of the various transistor oxide regions.

Figure 17:
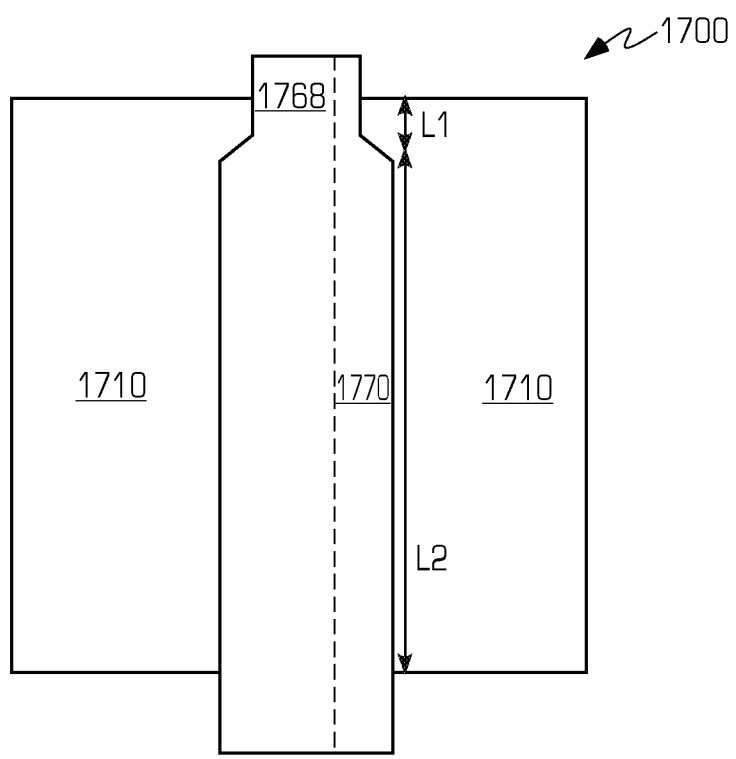
FIG. 17 is a perspective (top) view of an exemplary device consistent with certain aspects related to the present innovations.

FIG. 17 is a perspective (top) view of an exemplary device consistent with certain aspects related to the present innovations. Referring to FIG. 17, a composite device 1700 is shown including a substrate 1710 with source/drain regions, and an oxide region 1768 of varying dimension. Consistent with such exemplary aspects, a metal oxide semiconductor device may include a substrate 1710 of semiconductor material of a first conductivity type, a source region and a drain region in the substrate, wherein the source region and the drain region are of a second conductivity type and spaced apart from each other defining a channel region therebetween, an insulating layer 1768 disposed over the channel region of the substrate, and a gate portion above the insulating layer. The oxide region 1768 may be characterized as having first and second parts or "insulating portions," similar to those set forth above, each associated with complementary source and drain regions. As shown by way of example in the illustration of FIG. 17, the first insulating portion or the second insulating portion is fabricated of varying length and/or of different surface area or volumetric dimension in the length direction than the opposed insulating portion, to provide a first threshold voltage that differs from a second threshold voltage associated with the opposed insulating portion. In FIG. 17, to illustrate one exemplary implementation of differing threshold voltages as a function of such length dimensional change, exemplary oxide region 1768 may be varied on one side or insulating portion 1770, adjacent to a source or drain region, by lengthening or shortening the two length dimensions L1, L2 of the oxide layer adjacent that source/drain. The two differing insulating portions, one on each side of the channel, would then typically be characterized by differing threshold voltages.

It is to be understood that the foregoing description is intended to illustrate and not to limit the scope of the invention, which is defined by the scope of the appended claims. Other embodiments are within the scope of the following claims.

The invention claimed is:

1. A sensing circuit comprising:
   a data column including an output voltage node, a memory cell, a first PMOS transistor that is diode-connected, and a first differential threshold NMOS transistor having a drain connected to a drain of the first PMOS transistor to form the output voltage node and a source connected to a first node; and
   a first memory column comprising a second differential threshold NMOS transistor having a drain connected to the first node; and
   a second memory column connected to the first node in parallel with the first memory column, wherein each memory column includes a differential threshold MOS transistor;

wherein one or more of the differential threshold transistors are transistors that each have a gate-to-source threshold voltage that differs from a gate-to-drain threshold voltage;
wherein one or more of the differential threshold transistors comprises:
a substrate of semiconductor material of a first conductivity type;
a first region and a second region in the substrate, wherein the first and second regions are of a second conductivity type and spaced apart from each other defining a channel region therebetween;
an insulating layer disposed over the channel region of the substrate, wherein the insulating layer comprises opposed insulating portions including a first insulating portion adjacent the first region and a second insulating portion adjacent the second region; and
a gate portion above the insulating layer;
wherein each insulating portion characterizes a threshold voltage between the gate and the first region or the second region adjacent each insulating portion; and
wherein the first insulating portion is fabricated with varying dimension including a first thickness different than a second thickness of the second insulating portion to provide a first threshold voltage that differs from a second threshold voltage associated with the opposed insulating portion.

2. The sensing circuit of claim 1 further comprising one or more additional memory columns.

3. The sensing circuit of claim 1 wherein the first differential threshold NMOS transistor is a cascoding transistor.

4. The sensing circuit of claim 1 wherein one or more of the differential threshold transistor(s) is/are cascoding transistor(s).

5. The sensing circuit of claim 1, wherein one or more of the differential threshold MOS transistors are transistors having a channel region including a first junction region and a second junction region, wherein shape of the first insulating portion or shape or implantation of the first junction region are of varying dimension to provide a gate-to-source threshold voltage that differs from a gate-to-drain threshold voltage specified via dimension of one or both of the second insulating portion and/or the second junction region.

6. The sensing circuit of claim 1 wherein one or more of the differential threshold transistors includes a channel region comprising junction regions including a first junction region adjacent the first region and a second junction region adjacent the second region, the first junction region and the second junction region being opposed from each other; and
wherein one or both of shape or implantation of the first junction region or the second junction region are of varying dimension to provide a first threshold voltage that differs from a second threshold voltage associated with the opposed junction region.

7. The sensing circuit of claim 1 wherein one or more of the differential threshold transistors comprises:
a substrate of semiconductor material of a first conductivity type;
a first region and a second region in the substrate, wherein the first region and the second region are of a second conductivity type and spaced apart from each other defining a channel region therebetween;
a charge trapping region that yields a first threshold voltage associated with the first region or a second threshold voltage associated with the second region.

8. The circuit of claim 1 wherein the first thickness is varied via removal of an offset region from the insulating layer.

9. The circuit of claim 1 wherein the first insulating portion is varied to provide for the differing first threshold voltage.

10. The circuit of claim 1 wherein a width of the first insulating portion is varied to provide for the differing first threshold voltage.

11. The circuit of claim 1 wherein the first insulating portion includes a region of oxide material removed from the insulating layer to effect a threshold voltage that differs from the second threshold voltage of the second insulating portion.

12. The sensing circuit of claim 1 wherein one or more of the differential threshold MOS transistors are transistors having a channel region including a first junction region and a second junction region, wherein shape of the first insulating portion or shape or implantation of the first junction region are of varying dimension to provide a gate-to-source threshold voltage that differs from a gate-to-drain threshold voltage specified via dimension of one or both of the second insulating portion and/or the second junction region.

13. The sensing circuit of claim 1 wherein one or more of the differential threshold transistors includes a channel region comprising junction regions including a first junction region adjacent the first region and a second junction region adjacent the second region, the first junction region and the second junction region being opposed from each other; and
wherein one or both of shape or implantation of the first junction region or the second junction region are of varying dimension to provide a first threshold voltage that differs from a second threshold voltage associated with the opposed junction region.

14. The sensing circuit of claim 1 wherein one or more of the differential threshold transistors comprises:
a substrate of semiconductor material of a first conductivity type;
a first region and a second region in the substrate, wherein the first region and the second region are of a second conductivity type and spaced apart from each other defining a channel region therebetween;
a charge trapping region that yields a first threshold voltage associated with the first region or a second threshold voltage associated with the second region.

15. The sensing circuit of claim 1 wherein one or more of the differential threshold transistors comprises:
a substrate of semiconductor material of a first conductivity type;
a first region and a second region in the substrate, wherein the first region and the second region are of a second conductivity type and spaced apart from each other defining a channel region therebetween;
an insulating layer disposed over the channel region of the substrate, wherein the insulating layer comprises opposed insulating portions including a first insulating portion adjacent the first region and a second insulating portion adjacent the second region, and wherein each insulating portion defines a threshold voltage between the gate and the first region or the second region associated with each insulating portion; and
a gate portion above the insulating layer;
wherein the first insulating portion or the second insulating portion is fabricated of varying length and width, and of different dimension than the opposed insulating portion, to provide a first threshold voltage that differs from a second threshold voltage associated with the opposed insulating portion.

16. A sensing circuit comprising:
a data column including an output voltage node, a memory cell, a first PMOS transistor that is diode-connected, and a first differential threshold NMOS transistor having a drain connected to a drain of the first PMOS transistor to form the output voltage node and a source connected to a first node; and a first memory column comprising a second differential threshold NMOS transistor having a drain connected to the first node; and a second memory column connected to the first node in parallel with the first memory column, wherein each memory column includes a differential threshold MOS transistor;

wherein one or more of the differential threshold transistors are transistors that each have a gate-to-source threshold voltage that differs from a gate-to-drain threshold voltage;

wherein one or more of the differential threshold transistors comprises:

a substrate of semiconductor material of a first conductivity type;

a first region and a second region in the substrate, wherein the first region and the second region are of a second conductivity type and spaced apart from each other defining a channel region therebetween;

an insulating layer disposed over the channel region of the substrate, wherein the insulating layer comprises opposed insulating portions including a first insulating portion adjacent the first region and a second insulating portion adjacent the second region, and wherein each insulating portion defines a threshold voltage between the gate and the first region or the second region associated with each insulating portion; and a gate portion above the insulating layer;

wherein the first insulating portion or the second insulating portion is fabricated of varying length and width, and of different dimension than the opposed insulating portion, to provide a first threshold voltage that differs from a second threshold voltage associated with the opposed insulating portion.

17. The sensing circuit of claim 16 further comprising one or more additional memory columns.

18. The sensing circuit of claim 16 wherein the first differential threshold NMOS transistor is a cascoding transistor.

19. The sensing circuit of claim 16 wherein one or more of the differential threshold transistor(s) is/are cascoding transistor(s).

20. The sensing circuit of claim 16 wherein one or more of the differential threshold MOS transistors are transistors having a channel region including a first junction region and a second junction region, wherein shape of the first insulating portion or shape or implantation of the first junction region are of varying dimension to provide a gate-to-source threshold voltage that differs from a gate-to-drain threshold voltage specified via dimension of one or both of the second insulating portion and/or the second junction region.

21. The sensing circuit of claim 16 wherein one or more of the differential threshold transistors includes a channel region comprising junction regions including a first junction region adjacent the first region and a second junction region adjacent the second region, the first junction region and the second junction region being opposed from each other; and wherein one or both of shape or implantation of the first junction region or the second junction region are of varying dimension to provide a first threshold voltage that differs from a second threshold voltage associated with the opposed junction region.

22. The sensing circuit of claim 16 wherein one or more of the differential threshold transistors comprises:

a substrate of semiconductor material of a first conductivity type;

a first region and a second region in the substrate, wherein the first region and the second region are of a second conductivity type and spaced apart from each other defining a channel region therebetween;

a charge trapping region that yields a first threshold voltage associated with the first region or a second threshold voltage associated with the second region.

23. The sensing circuit of claim 16 wherein the first insulating portion is varied to provide for the differing first threshold voltage.

24. The sensing circuit of claim 16 wherein a width of the first insulating portion is varied to provide for the differing first threshold voltage.

25. The sensing circuit of claim 16 wherein the first insulating portion includes a region of oxide material removed from the insulating layer to effect a threshold voltage that differs from the second threshold voltage of the second insulating portion.

26. The sensing circuit of claim 16 wherein one or more of the differential threshold MOS transistors are transistors having a channel region including a first junction region and a second junction region, wherein shape of the first insulating portion or shape or implantation of the first junction region are of varying dimension to provide a gate-to-source threshold voltage that differs from a gate-to-drain threshold voltage specified via dimension of one or both of the second insulating portion and/or the second junction region.

27. The sensing circuit of claim 16 wherein one or more of the differential threshold transistors includes a channel region comprising junction regions including a first junction region adjacent the first region and a second junction region adjacent the second region, the first junction region and the second junction region being opposed from each other; and wherein one or both of shape or implantation of the first junction region or the second junction region are of varying dimension to provide a first threshold voltage that differs from a second threshold voltage associated with the opposed junction region.

28. The sensing circuit of claim 16 wherein one or more of the differential threshold transistors comprises:

a substrate of semiconductor material of a first conductivity type;

a first region and a second region in the substrate, wherein the first region and the second region are of a second conductivity type and spaced apart from each other defining a channel region therebetween;

a charge trapping region that yields a first threshold voltage associated with the first region or a second threshold voltage associated with the second region.

29. The sensing circuit of claim 16 wherein one or more of the differential threshold transistors comprises:

a substrate of semiconductor material of a first conductivity type;

a first region and a second region in the substrate, wherein the first region and the second region are of a second conductivity type and spaced apart from each other defining a channel region therebetween;

an insulating layer disposed over the channel region of the substrate, wherein the insulating layer comprises opposed insulating portions including a first insulating portion adjacent the first region and a second insulating portion adjacent the second region, and wherein each insulating portion defines a threshold voltage between the gate and the first region or the second region associated with each insulating portion; and a gate portion above the insulating layer;
wherein the first insulating portion or the second insulating portion is fabricated of varying length and width, and of different dimension than the opposed insulating portion, to provide a first threshold voltage that differs from a second threshold voltage associated with the opposed insulating portion.

* * * * *